United States Patent [19]

Casey et al.

[11] Patent Number: 5,468,445
[45] Date of Patent: Nov. 21, 1995

[54] CERAMIC VIA COMPOSITION, MULTILAYER CERAMIC CIRCUIT CONTAINING SAME, AND PROCESS FOR USING SAME

[75] Inventors: Jon A. Casey, Poughkeepsie, N.Y.; Renuka S. Divakaruni, Ridgefield, Conn.; Govindarajan Natarajan, Pleasant Valley; Srinivasa S. N. Reddy, LeGrangeville, both of N.Y.; Manfred Sammet, Schoenaich, Germany

[73] Assignee: International Business Machines Corporation, Armonk, N.Y.

[21] Appl. No.: 281,716

[22] Filed: Jul. 28, 1994

Related U.S. Application Data

[62] Division of Ser. No. 890,898, May 29, 1992, Pat. No. 5,336,444.

[51] Int. Cl.[6] ........................................ B22F 7/08
[52] U.S. Cl. ................ 419/19; 419/36; 419/45; 419/53; 419/54; 427/123; 427/126.1
[58] Field of Search ...................... 419/53, 54, 19, 419/36, 45; 428/546; 427/123, 126.1

[56] References Cited

U.S. PATENT DOCUMENTS

| | | | |
|---|---|---|---|
| 4,234,367 | 11/1980 | Herron et al. | 156/89 |
| 4,409,261 | 10/1983 | Kuo | 427/96 |
| 4,493,789 | 1/1985 | Ueyama et al. | 252/514 |
| 4,540,604 | 11/1985 | Siuta | 427/96 |
| 4,594,181 | 6/1986 | Siuta | 252/512 |
| 4,619,836 | 10/1986 | Prabhu et al. | 417/41 |
| 4,687,597 | 8/1987 | Siuta | 252/512 |
| 4,714,570 | 12/1987 | Nakatani et al. | 252/518 |
| 4,863,683 | 9/1989 | Nakatani et al. | 419/10 |
| 4,880,684 | 11/1989 | Boss et al. | 428/209 |
| 4,910,643 | 3/1990 | Williams | 361/414 |

FOREIGN PATENT DOCUMENTS

| | | | |
|---|---|---|---|
| 2-126700 | 5/1990 | Japan | H05K 3/46 |
| 1597572 | 9/1981 | United Kingdom | C09C 1/62 |

OTHER PUBLICATIONS

Research Disclosure, No. 316, Aug. 1990, Emsworth GB, XP 000141001 31695, "Formation of Bismuth Containing Cu Vias in Ceramic Packages".

IBM Technical Disclosure Bulletin, vol. 27, No. 4B, Sep. 1984, p. 2658, S. Wen, "Metal Paste Composition for Glass–Ceramic Copper System".

*Primary Examiner*—Donald P. Walsh
*Assistant Examiner*—Daniel Jenkins
*Attorney, Agent, or Firm*—Ira David Blecker

[57] ABSTRACT

A novel metal filled via composition for use with ceramics. The via composition can be formulated to have a volume shrinkage approximating that of the ceramic material, and thus overcomes the problem of volume shrinkage mismatch between the via (particularly copper filled via) and ceramic upon sintering. The novel via composition exhibits enhanced adhesion to the ceramic. A sintering process by which shrinkage of the novel via composition is controlled and adhesion is improved is also disclosed.

6 Claims, 3 Drawing Sheets

CERAMIC VIA COMPOSITION, MULTILAYER CERAMIC CIRCUIT CONTAINING SAME, AND PROCESS FOR USING SAME

This application is a divisional of U.S. patent application Ser. No. 07/890,898 filed on May 29, 1992, now U.S. Pat. No. 5,336,444.

FIELD OF THE INVENTION

The present invention provides a metal filled via composition for use with co-fired glass or ceramic (hereinafter just ceramic) structures. The via composition can be formulated to have a volume shrinkage approximating that of the ceramic, and thus overcomes the problem of volume shrinkage mismatch between the via (particularly copper filled via) and the ceramic upon sintering. The novel via composition exhibits enhanced adhesion to the ceramic material.

The present invention also provides a sintering process by which shrinkage of the novel via composition is controlled and adhesion is improved.

BACKGROUND OF THE INVENTION

Ceramic structures, usually and preferably multilayered, are used in the production of electronic substrates and devices. Many different types of structures can be used, and a few of these structures are described below. For example, a multilayered ceramic substrate may comprise patterned metal layers which act as electrical conductors sandwiched between ceramic layers which act as insulators. The substrates may be designed with termination pads for attaching semiconductor chips, connector leads, capacitors, resistors, covers, etc. interconnection between buried conductive levels can be achieved through vias formed by metal paste-filled holes in the individual ceramic layers formed prior to lamination, which, upon sintering, will become a sintered dense metal interconnection of metal-based conductor.

In general, conventional ceramic structures are formed from ceramic greensheets which are prepared by mixing a ceramic particulate, a thermoplastic polymeric binder, plasticizers and solvents. This composition is spread or cast into ceramic sheets or slips from which the solvents are subsequently volatilized to provide coherent and self-supporting flexible green sheets. After blanking, punching, screening, stacking and laminating, the greensheets are eventually fired at temperatures sufficient to drive off the polymeric binder resin and sinter the ceramic particulates together into a densified ceramic substrate.

The electrical conductors used in formation of the electronic substrate may be high melting point metals such as molybdenum and tungsten or a noble metal such as gold. However, it is more desirable to use a conductor having a low electrical resistance and low cost, such as copper and alloys thereof.

A major problem in the production of multilayer ceramic structures is the occurrence of gapping between the metal via and the ceramic material which occurs as a result of the volume shrinkage mismatch between the metal vias and the bulk ceramic, and also in part by the insufficient adhesion between the metal via and the surrounding ceramic.

A typical via paste composition may comprise metal particles, an ethyl cellulose organic binder, solvents, plasticizers and flow control agents.

It is known that the addition of small amounts of powdered glass or ceramic particles (frit) to a via composition will reduce the stress resulting from the thermal expansion mismatches between metals and ceramics. The amount of frit is kept small to maintain the highest possible electrical conductivity required for high performance circuitry. Useful paste compositions contain about 10% of the powdered frit as part of the powdered metal component.

However, even after addition of a small amount of frit to, for example, a copper paste, the volume shrinkage of the copper paste is greater than 40%, even after the highest possible solids loading. In fact, the theoretical volume shrinkage of a copper paste containing 88 wt % copper is 55%. The typical volume shrinkage of ceramics on sintering, on the other hand, is approximately 40%. This difference in the total volume shrinkage between the conductor and ceramic (i.e., the volume shrinkage mismatch) results in the formation of gaps between the vias and the bulk ceramic.

To date, it has not been possible to maintain via integrity with regard to conductivity, while matching shrinkage rates and attempting to promote bonding of the metal to the dielectric.

For example, U.S. Pat. No. 4,880,684 (Boss et al.) describes advantages of using glass-ceramic composites, including low dielectric constant, favorable coefficient of thermal expansion, and the ability to sinter at comparatively low temperatures (850° C.–1,000° C.), making possible their use with metals such as gold, silver and copper. A uniform gap is created between the ceramic and the associated internal metal in order to provide an expansion zone between the thermally mismatched materials. Boss et al. teach that the hermeticity disadvantages associated with the gap can be overcome by the use of capture pads, which provide hermeticity, relieve stress and provide a planar base for mounting devices. Boss et al. thus teach accommodation, rather than elimination, of the gap resulting from volume shrinkage mismatch between metal filled via or paste and ceramics.

U.S. Pat. No. 4,687,597 (Siuta) describes the use of copper conductor compositions in microcircuits, and the problems of oxidation of copper during firing. Siuta teaches a fritless copper conductor composition suitable for overprinting on copper, consisting of finely divided copper particles, coarse copper particles, a reducible heavy metal oxide, and optionally a refractory metal and/or high surface area noble metal. In the case of tungsten as a refractory metal, the tungsten acts as a reducing agent and serves as an oxygen scavenger.

U.S. Pat. No. 4,493,789 (Ueyama et al.) discloses mixing aluminum oxide, silicon dioxide, or similar oxide with a high melting point metal powder (such as molybdenum or platinum) in a paste for ceramic metallization. The metal particle size is from 0.3 to 8.0 microns and the weight percent of oxide powder added to the metal powder is from 0.1 to 3.0. There is no mention of controlling shrinkage rate.

U.S. Pat. No. 4,409,261 (Kuo) discloses the use of a copper powder and glass frit mixed into a paste for use in copper metal process. The copper powder has a particle size from 1.0 to 5.0 microns while the glass frit has submicron particle size. The glass frit is any low melting point frit such as lead borosilicate glass. The copper may or may not be pure. This process eliminates the need for a protective atmosphere during firing of the metal conductor. There is no mention of controlling the shrinkage rate of copper.

U.S. Pat. No. 4,619,836 (Prabhu et al.) discloses the use of a thick film metallic ink process which uses an oxygen or equivalent plasma to remove the organic binder. It is indicated that this does not oxidize the metal particles and in fact removes any surface oxidation present. Because the ink has a small particle glass frit added to it, the composition is then fired at a higher temperature, above the glass transition temperature, to complete the formation of the metal pattern.

U.S. Pat. No. 4,540,604 (Siuta) discloses the use of small copper particles, with an average size of from 2.0 to 4.0 microns with an oxide coating, to prepare a copper metallization paste. The oxide coating decomposes upon firing and the resulting metal retains its physical characteristics even after multiple firings because of a non-cuprous metal additive in amounts of from 0.2% to 5.0% by weight.

SUMMARY OF THE INVENTION

With the foregoing in mind, it is a principle object of this invention to overcome the problem of gapping between a via composition, particularly a copper via composition, and a ceramic material.

It is a further object of the present invention to promote strong adhesion between the via, and particularly copper containing via, and ceramic.

These and other objects of the present invention are accomplished by a metallurgical paste comprising a conductive first metal, an oxidizable second metal, and an organic medium. In a preferred embodiment of the invention, the conductive first metal is copper and the oxidizable second metal is selected from the group consisting of iron, nickel and cobalt. In a most preferred embodiment, the conductive first metal is copper, and the oxidizable second metal is iron in an amount of between 5% to 25% based on the total amount by weight of metals in the via composition. With respect to this most preferred embodiment, the invention is based in part on controlling the oxidation, and thus expansion, of iron to magnetite or hematite during sintering, which in turn permits control of copper shrinkage. By forming hematite at a lower temperature, a controlled amount of cuprous oxide can be introduced into the conductor, which results in enhancement of adhesion.

In a further embodiment of the invention, multilayer ceramic circuit modules are formed using the via composition of the present invention in accordance with a specified steam sintering cycle.

These and other objects, features and advantages of the present invention will be appreciated upon reading of the following description of the invention taken in conjunction with the attached drawings, with the understanding that some modifications, variations and changes of the same could be made by the skilled person in the art to which the invention pertains without departing from the spirit of the invention or the scope of claims appended hereto.

DETAILED DESCRIPTION OF THE INVENTION

Figure 1:
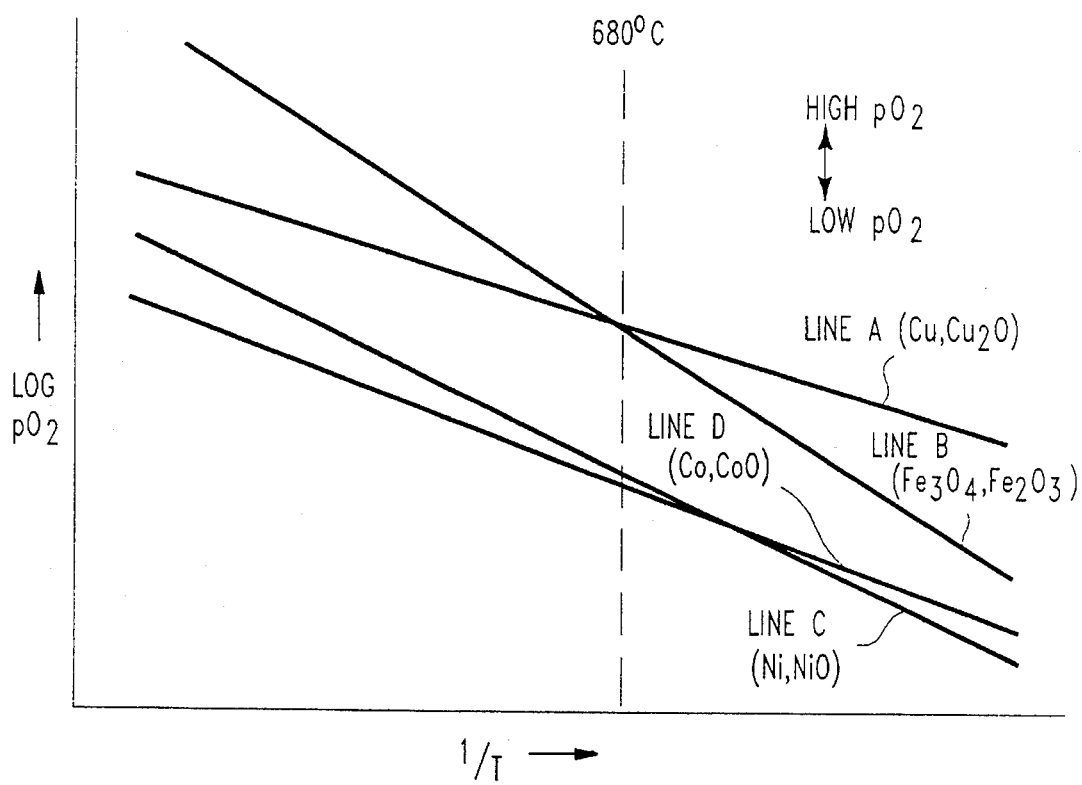
FIG. 1 is a chart of the partial pressure of oxygen ($pO_2$) versus the inverse of temperature illustrating the thermodynamic relationships involved in this invention.

The via composition of the present invention may be used in any electronic device in which it is desired to control the volume shrinkage of the via composition to that of the dielectric material. For examples of a thick film, multilayered interconnected circuit board in which the via composition and sintering process of the present invention can be applied, see U.S. Pat. No. 4,910,643 (Williams) and U.S. Pat. No. 4,234,367 (Herron et al.), the disclosures of which are incorporated herein by reference.

As the dielectric materials, any of the conventionally known glass or ceramic dielectric materials may be used. For purposes of illustration, and not limitations, these dielectric materials may include glass-ceramic materials or alumina mixed with low temperature glasses such as borosilicate glasses. The glass-ceramic materials are the most preferred materials for purposes of the present invention. Some examples of these glass-ceramic materials are listed in Table I.

The shrinkage rate of the ceramic is determined in part by the amount of organics in the green sheet. Typically, total shrinkage of the dielectric material is approximately 40 vol %.

One or more of the via compositions may be used in a single multilayer electronic structure, depending on desired characteristics such as optimization of electrical conductivity.

A typical prior art via composition may contain frit. Many varieties of finely divided frit can be used, including calcium, magnesium alumino-silicate, alumino-borosilicate, and alumina-glasses. However, frits are added to control shrinkage. Since the novel via compositions of the present invention contain an oxidizable metal which controls shrinkage, frits are not necessary or desired for the via compositions of the present invention.

The shrinkage volume of the via upon sintering is dependent upon paste composition. Typically, for a via composition containing only copper metal, shrinkage is greater than 50 vol %. An objective of the present invention is to adjust the volume shrinkage of the via composition to approximately that of the ceramic, and this is accomplished by adding an oxidizable metal to the paste.

More specifically, the metallurgical via composition of the present invention is comprised of a conductive first metal, an oxidizable second metal, and an organic medium.

The conductive first metal can be any of the known materials used in the art for this purpose, but is most preferably copper. The conductive first metal constitutes the main ingredient of the via

TABLE 1
GLASS CERAMIC COMPOSITIONS (WEIGHT PERCENT)

| | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| $SiO_2$ | 55.0 | 54.5 | 54.5 | 52.3 | 57.8 | 60.0 | 50.0 | 53.9 | 54.0 | 55.0 | 60.0 | 54.5 | 57.0 | 55.0 | 47.0 | 53.9 | 54.0 | 54.5 | 54.0 | 54.0 |
| $Al_2O_3$ | 21.1 | 21.0 | 21.0 | 19.7 | 22.2 | 18.2 | 22.9 | 20.7 | 21.0 | 21.0 | 17.0 | 20.0 | 21.0 | 21.0 | 33.5 | 20.8 | 22.0 | 21.3 | 22.0 | 21.0 |
| MgO | 22.3 | 19.8 | 19.8 | 24.0 | 16.0 | 17.8 | 22.2 | 19.6 | 19.0 | 18.0 | 18.0 | 20.0 | 20.0 | 22.0 | 13.5 | 19.6 | 20.0 | 19.9 | 20.0 | 22.0 |
| $B_2O_3$ | 1.3 | 1.0 | 1.0 | 1.0 | 1.0 | 1.0 | 1.1 | 1.0 | 1.0 | 1.0 | 1.0 | 1.0 | 1.0 | 2.0 | 3.0 | 1.0 | 1.0 | 1.0 | 1.0 | 1.0 |
| $P_2O_5$ | 0.3 | 2.7 | 2.7 | 3.0 | 3.0 | 3.0 | 1.8 | 2.8 | 3.0 | 3.0 | 3.0 | 1.5 | 1.0 | | 3.0 | 2.7 | 2.0 | 2.8 | 2.0 | |
| $CeO_2$ | | 1.0 | | | | | | | | | | | | | | | | | | |
| MnO | | | 1.0 | | | | | | | | | | | | | | | | | |
| $ZrO_2$ | | | | | | | | | 2.0 | | | 2.0 | | | | | | | | |
| CaO | | | | | | | | 2.0 | | | | 1.0 | | | | | | | | |
| NiO | | | | | | | | | | 2.0 | | | | | | | | | | |
| $Li_2O$ | | | | | | | | | | | 1.0 | | | | | | | | | |
| $Fe_2O_3$ | | | | | | | | | | | | | | | 2.0 | | | | | |
| $Na_2O$ | | | | | | | | | | | | | | | | 1.0 | | | | |
| $TiO_2$ | | | | | | | | | | | | | | | | | 1.0 | | | |
| ZnO | | | | | | | | | | | | | | | | | | | 1.0 | |
| CuO | | | | | | | | | | | | | | | | | | | | 2.0 | composition. Accordingly, the proportion of the first metal is not given, but can be determined by simply subtracting the amount of the second metal from the total metals present in the via composition.

The oxidizable second metal can be any material which is oxidized upon sintering, and is preferably iron, nickel, or cobalt. The amount of the oxidizable second metal used is preferably within the range of 5% to 25%, more preferably 5% to 20%, based on the total metals in the via composition. Unless indicated otherwise, all parts and percentages indicated herein are by weight. If the amount of the oxidizable second metal is too small, the shrinkage of the via is not sufficiently controlled. As the amount of the oxidizable second metal is increased, the volume of shrinkage of the via composition is reduced. If the amount of the oxidizable second metal is too large, the via may not shrink sufficiently with respect to the dielectric material and achieve high density.

The oxidizable metal will, depending on sintering conditions, serve to (1) prevent the via metal, such as copper, from oxidizing, thereby allowing sintering of the copper to provide a dense, conductive via material, and (2) permit controlled oxidation of the via metal and thereby enhance adhesion. Furthermore, the oxidation of the added materials provides the necessary expansion of the via to match the shrinkage of, and therefore to maintain contact with, the dielectric body.

In a preferred embodiment of the present invention, between 5% to 25% iron is incorporated into a copper containing via paste to permit control of copper shrinkage as well as enhance adhesion. The oxidation of iron to either $Fe_3O_4$ (magnetite) or $Fe_2O_3$ (hematite) results in volume expansion. In addition, if the hematite is formed at a lower temperature, then the reaction between Cu and $Fe_2O_3$ introduces a controlled amount of $Cu_2O$ in the via and thus enhances adhesion to the ceramic material.

In a further embodiment of the invention, multilayer ceramic circuit modules are formed using the via composition of the present invention in accordance with a specified steam sintering cycle.

It bears repeating that an additional benefit of the invention may be realized by controlling the sintering cycle to allow high temperature oxidation (by reduction of some of the oxidized additive) of a small percentage of the copper to promote bonding of the via to the dielectric through the well-known eutectic effect.

Examples of sintering profiles are taught below. For the purposes of illustration, the present invention will now be discussed in the specific context of copper as the conductive first metal and iron as the oxidizable second metal. It is to be understood that the present invention is not limited to this illustrative embodiment.

The two chemical reactions to be controlled during sintering are:

Low Temperature:

$$4Fe + 3O_2 = 2Fe_2O_3; \; \delta V_1 > 0 \qquad (1)$$

High Temperature:

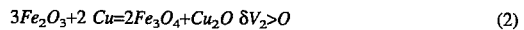

$$3Fe_2O_3 + 2\,Cu = 2Fe_3O_4 + Cu_2O \;\; \delta V_2 > 0 \qquad (2)$$

where $\delta V_1 > \delta V_2$.

Referring now to FIG. 1, the thermodynamic principle of this embodiment of the invention will be discussed. Lines A and B represent the equilibrium between Cu and $Cu_2O$, and between $Fe_3O_4$ and $Fe_2O_3$, respectively, for a range of partial pressure of oxygen ($pO_2$) and temperature conditions. Above line A, $Cu_2O$ is stable and below line A, Cu is stable. Above line B, $Fe_2O_3$ is stable and below Line B, $Fe_3O_4$ is stable. Lines A and B cross each other at about 680° C. Below about 680° C., $Fe_2O_3$ is stable in the presence of Cu metal; above about 680° C., $Fe_2O_3$ reacts with Cu to form $Fe_3O_4$ and $Cu_2O$.

The present invention takes advantage of these thermodynamic relationships in forming a via with reduced shrinkage upon sintering. Sintering profiles according to the present invention are shown in FIGS. 2 and 3.

Figure 2:
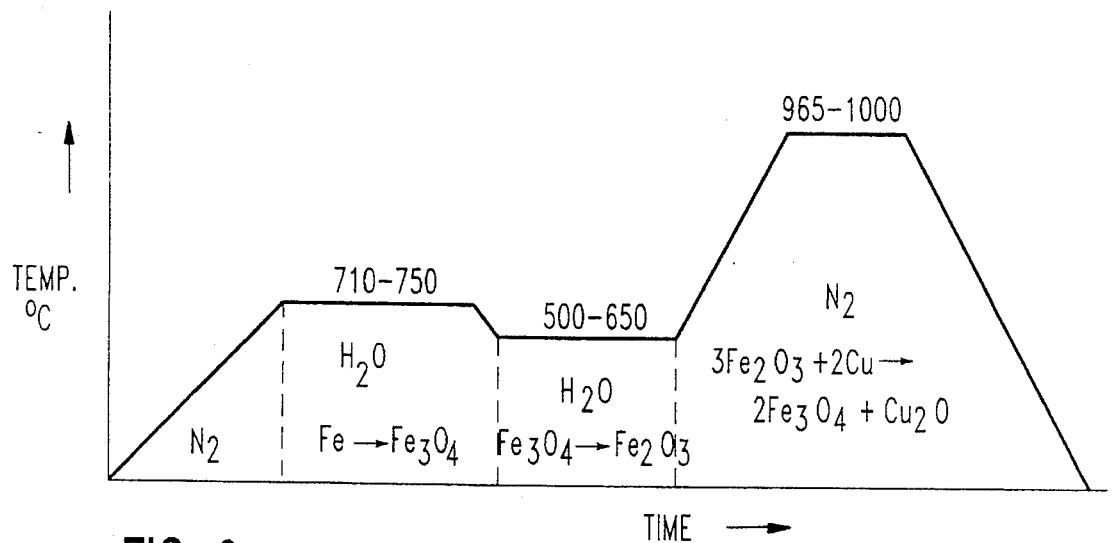
FIG. 2 shows a one-step steam sintering cycle effectively using one embodiment of the thermodynamic relationships represented in FIG. 1.

Referring now to FIG. 2, a first sintering profile is illustrated. The temperature is ramped up while maintaining a neutral ($N_2$) ambient to initiate pyrolysis of the organics in the green sheet and pastes. Argon or helium may be used in place of the $N_2$, if desired. Thereafter, at a temperature of 710°–750° C. in a steam atmosphere (steam+15–35 ppm. $H_2$), the pyrolyzed organics are oxidized. Since the atmosphere is only slightly oxidizing with respect to Cu, Fe is oxidized to $Fe_3O_4$ (Fe will preferentially oxidize with respect to Cu under these conditions). The temperature is then reduced to 500°–650° C. while maintaining the steam ambient so as to transform the $Fe_3O_4$ to $Fe_2O_3$. Then, the atmosphere is changed to nitrogen and the temperature is ramped up to 965°–1000° C. to densify the ceramic material. The important reaction (2) now occurs causing $Fe_2O_3$ to transform to $Fe_3O_4$ and $Cu_2O$. Thereafter, the temperature is reduced to room temperature while maintaining the neutral ambient.

Reaction (2) is important in two respects. The first is that the reaction is accompanied by a volume expansion which helps in matching the volume shrinkage of the via to that of the ceramic. The second is that the controlled formation of $Cu_2O$ improves bonding between the predominantly copper via and the ceramic material. The amount of $Cu_2O$ formed is dictated by the amount of Fe in the paste.

A sample substrate was formed consisting of glass-ceramic material and a Cu/Fe via paste. The glass-ceramic material was typical of that in Table I. The via paste consisted of 88% Cu+Fe (85% Cu+ 15% Fe, by total weight of metals), remainder ethyl cellulose binder and other organics. The substrate was sintered according to the sintering profile just described and illustrated in FIG. 2. The total shrinkage (as a percent of the theoretical) was 44.4%. This is to be compared with a normal shrinkage of 55% for a typical copper paste with 88% metals loading. The final composition of the via after sintering was, in weight percent: 64.2% Cu, 7.5% $Cu_2O$ and 28.3% $Fe_3O_4$.

A possible disadvantage of the sintering cycle shown in FIG. 2 is that the Cu might not always achieve sufficiently densified via structure due to the presence of $Fe_2O_3$ during the high densification segment of the sintering cycle. This could possibly even result in open porosity. This problem may be avoided by a two-step sintering cycle as shown in FIGS. 3A and 3B.

Figure 3A:
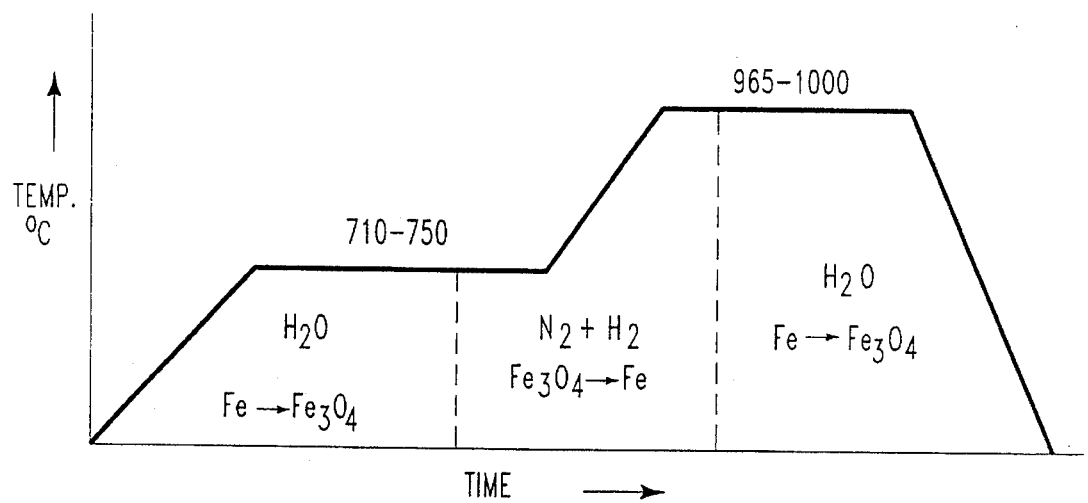
FIGS. 3A and 3B show a two-step steam sintering cycle effectively using the one embodiment of the thermodynamic relationships represented in FIG. 1.

Referring now to FIG. 3A, the temperature is ramped up from room temperature in a steam ambient to 710°–750° C. to cause pyrolysis and oxidation of the organics and oxidation of Fe to $Fe_3O_4$. The atmosphere is then switched to forming gas ($N_2+H_2$) and the temperature is ramped up to 965°–1000° C. During this segment of the sintering cycle, $Fe_3O_4$ is reduced to Fe which may form a Cu-Fe alloy with the copper in the via. Additionally, the via is densified (as is the ceramic) without the presence of $Fe_2O_3$. After at the densification temperature, the atmosphere is switched to a steam ambient that is slightly oxidizing to the Cu, i.e., just above line A in FIG. 1. This causes the Fe to oxidize to $Fe_3O_4$ with an accompanying volume expansion. The substrate is then cooled to room temperature.

Figure 3B:
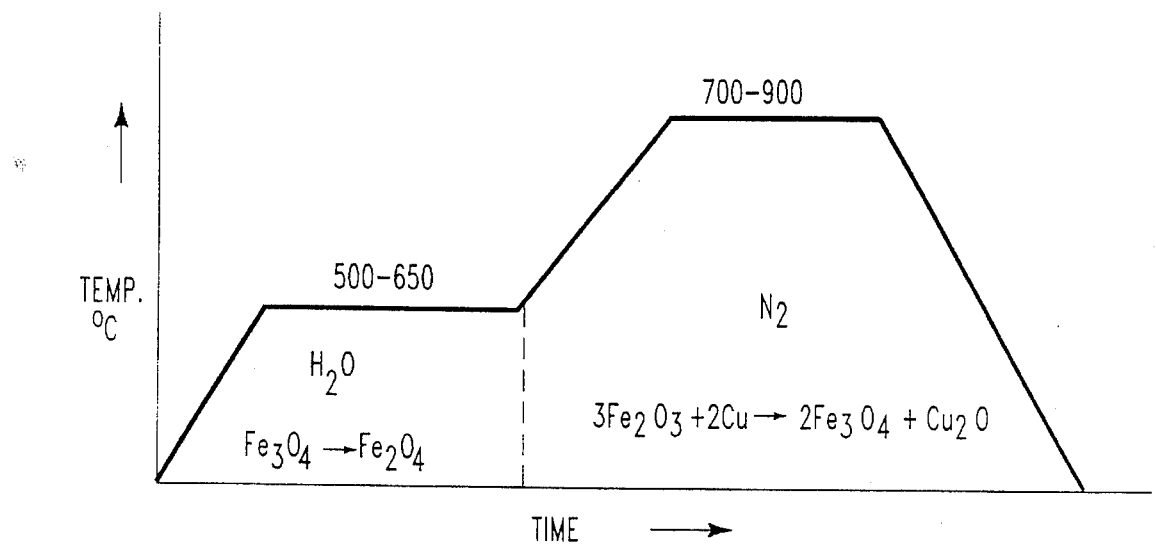

In the second step of the sintering cycle, as shown in FIG. 3B, the temperature is ramped up from room temperature to 500°–650° C. in steam to cause transformation of the $Fe_3O_4$ to $Fe_2O_3$. Then, the atmosphere is switched to a neutral ambient ($N_2$) and the temperature is ramped up to 700°–900° C. This temperature is just high enough for reaction (2) to occur, with the resulting formation of $Fe_3O_4$ and $Cu_2O$. While maintaining the neutral atmosphere, the temperature is lowered to room temperature.

As discussed previously, other oxidizable metals, such as nickel and cobalt, may be utilized in the via composition. The oxidation reactions for nickel and cobalt are as follows:

$$Ni+O_2=2NiO \qquad (3)$$

$$Co+O_2=2CoO \qquad (4)$$

Referring again to FIG. 1, line C represents the equilibrium reaction between Ni and NiO and line D represents the equilibrium reaction between Co and CoO. Above lines C and D, the oxides of Ni and Co will be stable. Since in the temperature range of interest the oxides of Ni and Co are stable in the presence of elemental Cu, the sintering profile must differ from the sintering profiles discussed earlier.

Figure 4:
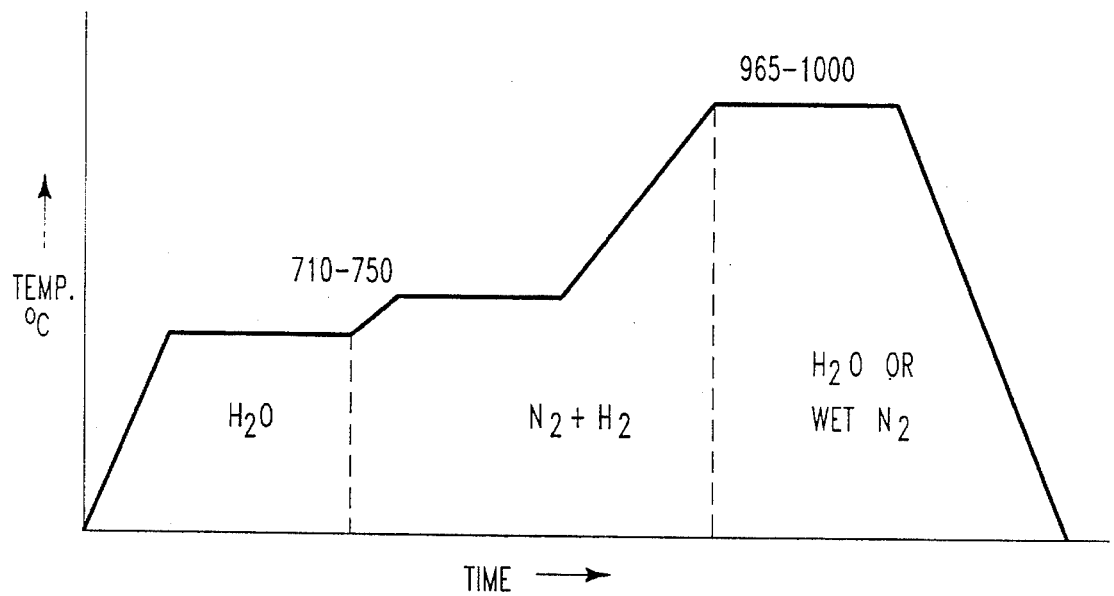
FIG. 4 shows a one-step sintering cycle effectively using a second embodiment of the thermodynamic relationships represented in FIG. 1.

A sample sintering profile is illustrated in FIG. 4. This profile would be similar, whether Ni or Co is used as the oxidizable metal. From room temperature, the temperature is ramped up to 710°–750° C. in steam for pyrolysis and oxidation of the organics. The oxidizable metal would oxidize under these conditions. Then, the ambient would be switched to forming gas ($N_2+H_2$) and the temperature raised to 965°–1000° C. to reduce the oxidizable metal to its metallic state. This step is necessary so that the metal, in its oxidizable state, does not interfere with the densification of the predominantly-copper via. Thereafter, the atmosphere is switched to steam or wet $N_2$ to oxidize the oxidizable metal according to reaction (3) or (4). The temperature would then be lowered to room temperature while maintaining the steam or wet $N_2$ ambient.

This embodiment of the invention is advantageous in that the oxidation of Ni or Co results in a volume expansion, thereby reducing the amount of shrinkage that the via would ordinarily experience. The steam or wet $N_2$ atmosphere may also be adjusted in the last segment of the sintering cycle to cause controlled oxidation of the Cu, thereby enhancing the adhesion of the via to the surrounding bulk ceramic material.

While the invention has been illustrated and described with respect to preferred embodiments, it is also to be understood that the invention is not limited to the precise constructions herein disclosed, and the right is reserved to all changes and modifications coming within the scope of the invention as defined in the appended claims.

What is claimed is:

1. A process for producing substrates having co-fired dielectric material and metal composition comprising:

providing to said dielectric material a fritless metallurgical paste, wherein said paste comprises a conductive first metal wherein said conductive first metal is copper and comprises about 95% to 75% based on the total metals in said fritless metallurgical paste composition;

an oxidizable second metal selected from the group consisting of iron, nickel and cobalt, wherein said oxidizable second metal comprises about 5% to 25% based on the total metals in said fritless metallurgical paste composition; and an organic medium in which said first and second metals are dispersed; and firing said fritless metallurgical paste and dielectric material at a temperature sufficient to effect removal of said organic medium, sintering of said first metal, and oxidation of said second metal.

2. The process of claim 1 wherein said oxidizable second metal is iron.

3. A process as in claim 2, wherein said firing is carried out under conditions to cause oxidation of Fe to $Fe_2O_3$, and to cause Cu to react with $Fe_2O_3$ to produce a sufficient amount of $Cu_2O$ in said metal to enhance adhesion of said metal to said dielectric material.

4. A process for producing hermetic substrates having co-fired dielectric material and metal, comprising:

providing a metallurgical paste comprising a conductive first metal and an oxidizable second metal, said first metal comprising from about 95% to 75% Cu and said second metal comprising from about 5% to 25% Fe by weight based on the total metals in said metallurgical paste composition, and an organic medium in which said first and second metal are dispersed, onto said dielectric material;

firing said paste and dielectric material at a temperature at which $3Fe+2O_2$ produce $Fe_3O_4$;

lowering the temperature to a temperature at which $Fe_3O_4$ is biased toward $Fe_2O_3$;

raising the temperature to a temperature at which $3Fe_2O_3 + 2Cu$ produces $2Fe_3O_4 + Cu_2O$.

5. A process for producing a hermetic substrate comprising a co-fired dielectric material and metal composition, said process comprising:

providing onto said dielectric material a metal comprising from about 95% to 75% Cu and from about 5% to 25% Fe by weight based on the total metals in said metal, and an organic medium in which said Fe and Cu are dispersed;

sintering at a first temperature;

lowering the temperature to a second temperature; and sintering at a third temperature, wherein said first temperature and atmosphere are favorable for the production of $Fe_2O_3$ in reaction (1):

$$4Fe + 3O_2 = 2Fe_2O_3; \delta V_1 > 0 \qquad (1),$$

said second temperature and atmosphere are favorable to the formation of $Fe_3O_4$ from $Fe_2O_3$; and said third temperature and atmosphere are those at which cuprous oxide can be formed according to the following reaction (2):

$$3Fe_2O_3 + 2Cu = 2Fe_3O_4 + Cu_2O; \delta V_2 > 0 \qquad (2),$$

where $\delta V_1 > \delta V_2$.

6. A process for producing hermetic substrates having co-fired dielectric material and metal, comprising the steps of:

(a) providing onto a dielectric material a metal comprising from about 95% to 75% Cu and from about 5% to 25% Fe by weight based on the total metals in said metal, and an organic medium in which said Fe and Cu are dispersed;

(b) partial sintering in an inert atmosphere;

(c) sintering at a temperature above 680° C. for a time sufficient to cause Fe to be oxidized to $Fe_3O_4$, and in an atmosphere wherein the $pO_2$ is sufficiently low that $Fe_3O_4$ is more stable than $Fe_2O_3$;

(d) reducing the temperature and increasing the $pO_2$ to the vicinity wherein $Fe_2O_3$ is more stable than $Fe_3O_4$; and (e) sintering in an inert atmosphere at a temperature and for a time sufficient to cause some $Fe_2O_3$ to react with Cu to produce $Fe_3O_4$ and $Cu_2O$.

* * * * *